(12) United States Patent
Chen

(10) Patent No.: US 10,830,828 B2
(45) Date of Patent: Nov. 10, 2020

(54) ELECTRONIC DEVICE AND BATTERY SAFETY MONITORING METHOD AND MONITORING SYSTEM THEREOF

(71) Applicant: GUANGDONG OPPO MOBILE TELECOMMUNICATIONS CORP., LTD., Guangdong (CN)

(72) Inventor: Wei Chen, Guangdong (CN)

(73) Assignee: GUANGDONG OPPO MOBILE TELECOMMUNICATIONS CORP., LTD., Guangdong (CN)

(*) Notice: Subject to any disclaimer, the term of this patent is extended or adjusted under 35 U.S.C. 154(b) by 0 days.

(21) Appl. No.: 16/487,594

(22) PCT Filed: Aug. 25, 2017

(86) PCT No.: PCT/CN2017/099134
§ 371 (c)(1),
(2) Date: Aug. 21, 2019

(87) PCT Pub. No.: WO2019/037115
PCT Pub. Date: Feb. 28, 2019

(65) Prior Publication Data
US 2019/0383882 A1    Dec. 19, 2019

(51) Int. Cl.
*G01R 31/392* (2019.01)
*G01R 31/3835* (2019.01)
(Continued)

(52) U.S. Cl.
CPC ......... *G01R 31/392* (2019.01); *G01R 31/371* (2019.01); *G01R 31/3835* (2019.01); *G08B 21/182* (2013.01); *H04M 1/0202* (2013.01)

(58) Field of Classification Search
CPC .. G01R 19/12; G01R 31/371; G01R 31/3835; G01R 31/392; G01R 31/52; G08B 21/182; H04M 1/0202
See application file for complete search history.

(56) References Cited

U.S. PATENT DOCUMENTS 5,489,836 A * 2/1996 Yuen ................. H02J 7/007184
320/148
8,797,171 B2 * 8/2014 Yasuda ................... H02J 7/007
340/636.1
(Continued)

FOREIGN PATENT DOCUMENTS

CN     101604849     12/2009
CN     101689684      3/2010
(Continued)

OTHER PUBLICATIONS

WIPO, English Translation of the ISR and WO for PCT/CN2017/099134, dated Mar. 28, 2018.
(Continued)

*Primary Examiner* — Omeed Alizada
(74) *Attorney, Agent, or Firm* — Hodgson Russ LLP

(57) ABSTRACT

The present disclosure provides an electronic device and a battery safety monitoring method and monitoring system. The battery safety monitoring method includes: obtaining a battery voltage of a battery of the electronic device in real time; determining whether a voltage jump occurs in the battery of the electronic device according to the battery voltage obtained in real time; and determining that the battery is abnormal currently, when the voltage jump occurs in the battery.

18 Claims, 4 Drawing Sheets

(51) Int. Cl.
   *G01R 31/371*      (2019.01)
   *G08B 21/18*       (2006.01)
   *H04M 1/02*        (2006.01)

(56) References Cited

U.S. PATENT DOCUMENTS

| | | | | |
|---|---|---|---|---|
| 2007/0188131 | A1* | 8/2007 | Guthrie | H01M 10/425 |
| | | | | 320/112 |
| 2017/0082693 | A1 | 3/2017 | Leidich et al. | |
| 2017/0123008 | A1 | 5/2017 | Frias et al. | |
| 2017/0126123 | A1* | 5/2017 | Hsiung | H02M 3/158 |

FOREIGN PATENT DOCUMENTS

| | | |
|---|---|---|
| CN | 101752844 | 6/2010 |
| CN | 203299318 | 11/2013 |
| CN | 103683388 | 3/2014 |
| CN | 103809124 | 5/2014 |
| CN | 104037736 | 9/2014 |
| CN | 105024411 | 11/2015 |
| CN | 105373117 | 3/2016 |
| CN | 105743532 | 7/2016 |
| CN | 105842554 | 8/2016 |
| CN | 106104285 | 11/2016 |
| CN | 106353690 | 1/2017 |
| CN | 107271918 | 10/2017 |

OTHER PUBLICATIONS

Anonymous, "Detect sudden voltage drop: All About Circuits," Apr. 2016, retrieved from the internet: <https://web.archive.org/web/20160418142741/https://forum.allaboutcircuits.com/threads/detect-sudden-voltage-drop.57443/> 25 pages.

EPO, Office Action for EP Application No. 17922405.0, dated Dec. 20, 2019.

SIPO, First Office Action for CN Application No. 201780003735.1, dated Nov. 7, 2019.

SIPO, Second Office Action for CN Application No. 201780003735.1, dated Mar. 5, 2020.

IPO, Office Action for IN Application No. 201917032106, dated Jun. 24, 2020.

SIPO, Rejection Decision for CN Application No. 201780003735.1, dated Aug. 10, 2020.

* cited by examiner

ELECTRONIC DEVICE AND BATTERY SAFETY MONITORING METHOD AND MONITORING SYSTEM THEREOF

CROSS-REFERENCE TO RELATED APPLICATIONS

This application is a U.S. national phase application of International Application No. PCT/CN2017/099134, filed Aug. 25, 2017, the entire disclosure of which is incorporated herein by reference.

TECHNICAL FIELD

The present disclosure relates to an electronic device technology field, and more particularly, to a battery safety monitoring method, a battery safety monitoring system, and an electronic device having the battery safety monitoring system.

BACKGROUND

A battery is a power source of a mobile terminal, and provides a long-term stable power supply for the mobile terminal such as a mobile phone. The earliest batteries used in mobile terminals are nickel-chrome batteries and nickel-hydrogen batteries. With the increasement of sizes and functions of screens of the mobile terminals, the capacity of nickel-chrome batteries and nickel-hydrogen batteries cannot satisfy the energy demand. Lithium batteries have many advantages, for example, high energy density and hence small size and light weight and larger capacity, quick charging and discharging, having no memory effect compared to the nickel-chrome batteries and nickel-hydrogen batteries, and minimal element damage to environment. The lithium batteries have gradually replaced the traditional nickel-chrome batteries and nickel-hydrogen batteries.

Although the lithium battery effectively solves the problem of battery capacity, it also causes safety problems. For example, when the lithium battery is damaged and becomes short-circuited, heat generates inside the battery cell. When the heat generates really fast, the battery would ignite or explode. Therefore, safety monitoring is required for the battery to prevent accidents.

SUMMARY

The present disclosure aims to solve at least one of the above problems to at least some extent.

Embodiments of the present disclosure provide a battery safety monitoring method. The method is applicable to an electronic device, and includes: obtaining a battery voltage of a battery of the electronic device in real time; determining whether a voltage jump occurs in the battery of the electronic device according to the battery voltage obtained in real time; and determining that the battery is abnormal currently, when the voltage jump occurs in the battery.

Embodiments of the present disclosure further provide a non-transitory computer-readable storage medium. The computer-readable storage medium is stored thereon with a computer program that, when executed by a processor, perform the battery safety monitoring method described above.

Embodiments of the present disclosure further provide a battery safety monitoring system. The system is applicable to an electronic device, and includes a differential amplification circuit and a controller. The differential amplification circuit is configured to detect a battery voltage of a battery of the electronic device in real time. The controller is coupled to the differential amplification circuit, and is configured to: determine whether a voltage jump occurs in the battery of the electronic device according to the battery voltage obtained in real time and determine that the battery voltage is abnormal currently when the voltage jump occurs in the battery.

Embodiments of the present disclosure further provide an electronic device. The electronic device includes a housing, a battery, a processor, a memory and a circuit board. The circuit board is enclosed by the housing. The processor and the memory are positioned on the circuit board. The battery is configured to provide power for the electronic device. The memory is configured to stored executable program codes. The processor is configured to run a program corresponding to the executable program codes by reading the executable program codes stored in the memory, to perform the battery safety monitoring method described above.

DETAILED DESCRIPTION

Figure 1:
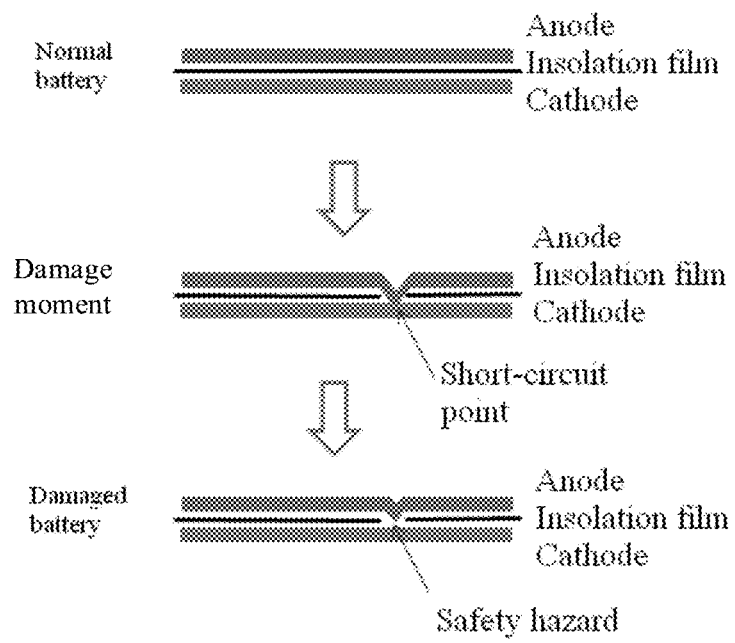
FIG. 1 is a schematic diagram of a battery damage process according to an embodiment of the present disclosure.

Embodiments of the present disclosure will be described in detail and examples of embodiments are illustrated in the drawings. The same or similar elements and the elements having the same or similar functions are denoted by like reference numerals throughout the descriptions. Embodiments described herein with reference to drawings are explanatory, serve to explain the present disclosure, and are not construed to limit embodiments of the present disclosure.

Before describing the battery safety monitoring method, the battery safety monitoring system and the electronic device having the battery safety monitoring system according to embodiments of the present disclosure, a structure of a battery generally used for the electronic device and its possible safety hazard will be described.

For example, a lithium battery mainly consists of a battery cell and a battery protection system. The battery cell is referred to as a "heart" of the lithium battery, the cell has cathode and anode materials, electrolyte, an isolation film and a casing, and the protection system of the battery is disposed externally. The cathode material of the battery cell is material including lithium molecules, such as lithium manganite and lithium cobalt oxide, and the anode material is graphite. The isolation film is disposed between the cathode and the anode of the battery. Generally, the isolation film is like a kind of paper folded repeatedly into a small battery box, and filled with cathode and anode materials and electrolyte. When charging is performed, an external electric field activates the lithium molecules in the cathode material, drives them to the anode and stores them in voids in the graphite carbon structure. The more lithium molecules are driven, the more energy is stored. When discharging is performed, the lithium ions in the anode are driven to the cathode, and turns to lithium molecules in the cathode material again, so the cycle to achieve charging and discharging of the battery.

The isolation film is mainly used to completely separate the cathode and anode materials of the cell. Once the cathode and the anode are in direct contact, an internal short circuit of the battery will occur, which brings certain safety hazards. Therefore, since a thin isolation film can be easily damaged, the isolation film should not be too thin. However, as consumers demand higher requirements for electronic devices, such as, thin and light mobile terminals, large screens and strong standby capability, manufacturers are seeking batteries with higher energy density. For example, the energy density of the battery can be improved by filling more cathode and anode materials. However, in the same volume, the more cathode and anode materials are filled, the thinner the isolation film becomes, and the isolation film is easily damaged if the battery is damaged by external impact, which leads to a short circuit.

As an example, when the battery is subjected to external mechanical damages such as crush damage, falling damage and puncturing damage, since the isolation film is thin, it is easy to cause damage to the isolation film and short circuit between the cathode and the anode, i.e., the internal short circuit in the battery. When the short circuit occurs, the battery voltage will be pulled down instantaneously, which is mainly because that a local internal short circuit point is formed inside the battery. The more seriously the battery is damaged, the more severely the voltage is pulled down.

Generally, relatively serious damage results in larger internal short-circuit area of the battery, and heat will generate continuously at the damage point, until the battery voltage drops to 0V. If the battery voltage is high, the battery may even be ignited and burned. Moreover, slight damage results in smaller internal short-circuit area of the battery, short-circuit current is formed at the short-circuit point, and since the large short-circuit current generates a large amount of heat at the short-circuit point, the short-circuit point is fused, and the battery voltage returns to the initial state. At this time, the battery may be used normally as a normal battery, but the battery already has the safety hazard, which may trigger the internal short circuit at any time during the later user, specifically as illustrated in FIG. 1. When the battery is damaged by external mechanical damages, most of the damages are slight damages, which results in temporary internal short circuit, and the internal short circuit of the battery will quickly return to the initial state. However, at this time, the isolation film has already been partially damaged. Therefore, it is generally difficult to monitor this kind of battery abnormality, and such a battery abnormality will bring certain safety risks to the electronic device.

As another example, during the charging and discharging process of the battery, lithium ions may accumulate in the cathode and the anode, and during accumulating, a dendrite will be produced as we can see that crystals grow on many things. The dendrite may become longer slowly, and in this process, it may puncture the isolation film, resulting in the internal short circuit of the battery. The above example describes the case where the battery is caused to occur the temporary internal short circuit due to external mechanical damage and then restored to the initial state. Such a case is more obvious at this time, that is, it is more likely to cause the internal short circuit of the battery again.

Once the short circuit occurs, a large amount of heat will be generated inside the battery cell during the use of the battery. This heat will vaporize the electrolyte inside the battery. If the heat is generated too fast, the gasification process will be very fast, and the air pressure inside the cell will increase. When the air pressure reaches a certain level that is unbearable for the casing, the casing will crack and cause an explosion, and the battery may also be ignited in contact with an open flame.

The higher the energy density is, the thinner the insolation film is, which results in that it is easy to damage the isolation film and further cause the safety accidents. Besides this, fast charging is also one of the main reasons for the safety hazard of the battery.

The so-called fast charging is the process in which the secondary rechargeable battery is charged quickly. For example, the charging process of the battery may include one or more of a trickle current charging phase, a constant current charging phase and a constant voltage charging phase. In the trickle current charging phase, the current feedback loop can be utilized such that the current entering the battery meets the expected charging current of the battery (e.g. the first charge current), for example, when the voltage is below 3.0V, the battery is pre-charged with a charging current of 100 mA. In the constant current charging phase, the current feedback loop can be utilized such that the current entering the battery meets the expected charging current of the battery (e.g. the second charge current, which is greater than the first charge current), for example, the charging current can vary from 0.1 C to a few C for different batteries, where C refers to the battery capacity. At this stage, standard charging is generally performed with a charging current of 0.1 C, and fast charging means charging at a current greater than 0.1 C to complete charging in a short time. In the constant voltage charging phase, the voltage feedback loop can be utilized such that the voltage applied to both ends of the battery satisfies the expected charging voltage of the battery, for example, when the battery voltage is equal to 4.2V, the charging process enters the constant voltage charging phase with a constant voltage of 4.2V, and when the battery is gradually fully charged, the charging current will gradually decrease, and the battery is deemed to be fully charged if the charging current is less than 100 mA.

In the constant current charging phase, the charging current is relatively large, for example, 0.2 C to 0.8 C and sometimes even 1 C, and the charging process of the battery is an electrochemical reaction process, which is accompanied by heat. A large amount of heat can be generated in a short time when the charging current is large, and if the insolation film is damaged, it is easy to cause short circuit of the cathode and the anode. Once the short circuit occurs, more heat is generated and the electrolyte is vaporized, and the air pressure inside the cell will increase. When the air pressure reaches a certain level that is unbearable for the casing, the casing will crack and causes an explosion, and the battery may also be ignited in contact with an open flame.

That is, once the battery has an internal short circuit, it indicates that the battery is abnormal, and in this case, the battery has certain safety hazards, which may cause safety accidents during use.

According to continuous research and experiments on the battery, the inventors of the present application have found that the voltage of the battery is relatively stable in normal use, however, once the battery is damaged, the short circuit may occur inside the battery, and thus the battery voltage will suddenly drop, and this voltage jump signal is very strong. The inventors have verified the existence of this voltage jump phenomenon through experiments. Therefore, according to the test results, the voltage jump signal appears once the battery is damaged.

Based on the discovery and a large number of experimental verifications, in order to effectively monitor whether the battery is damaged, to prevent the battery from safety hazards, and to further avoid safety incidents, the present disclosure provides effective safety monitoring method for abnormality of the battery.

The battery safety monitoring method, the battery safety monitoring system and the electronic device according to embodiments of the present disclosure will be described below with reference to the drawings.

It should be noted that the "electronic device" used in the embodiments of the present disclosure may include, but is not limited to, a device configured to receive/transmit communication signals via a wired connection (for example, public switched telephone network (PSTN), digital subscriber line (DSL) connection, digital cable connection, direct cable connection and/or another data connection/network) and/or via a wireless interface (for example, cellular network, wireless local area network (WLAN), digital TV network such as digital video broadcasting handheld (DVB-H) network, satellite network, an amplitude modulation-frequency modulation (AM-FM) broadcasting transmitter, and/or a wireless interface of another communication terminal). The terminal configured to communicate via the wireless interface may be referred to as "wireless communication terminal", "wireless terminal" and/or "mobile terminal". Examples of a mobile terminal include, but are not limited to a satellite phone or a cell phone, a terminal combining a cell radio phone and a personal communication system (PCS) having capability of data process, fax, and data communication, a personal digital assistant (PDA) including a radio phone, a pager, Internet/Intranet access, a web browser, a note pad & address book, a calendar and/or a global positioning system (GPS) receiver, and a common laptop and/or handheld receiver, or other electronic devices including a radio phone transceiver.

Figure 2:
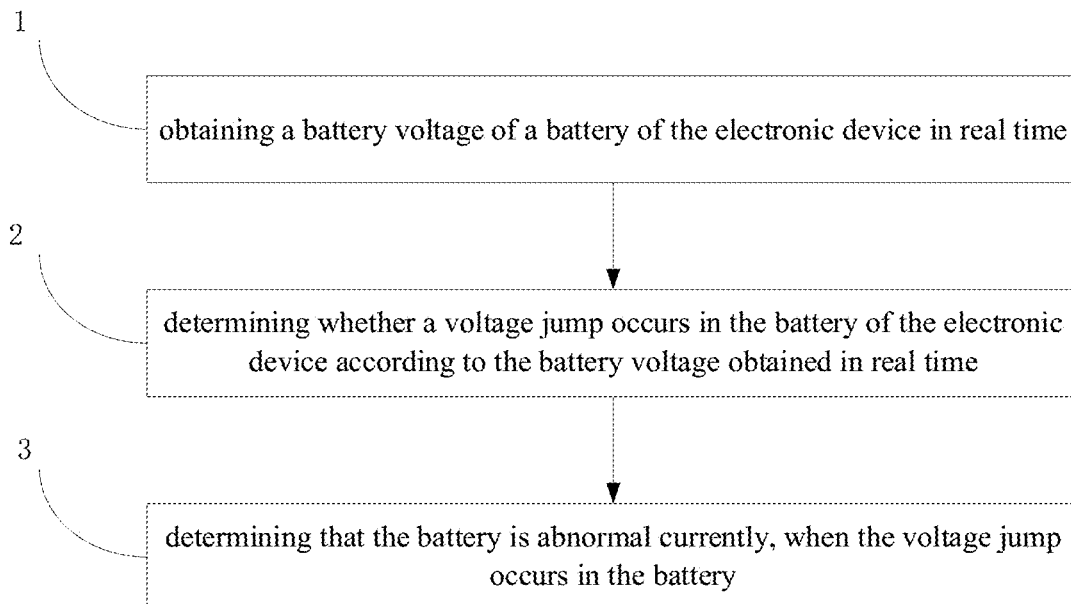
FIG. 2 is a flow chart of a battery safety monitoring method according to an embodiment of the present disclosure.

FIG. 2 is a flow chart of a battery safety monitoring method according to an embodiment of the present disclosure. The battery safety monitoring method is applicable to an electronic device. As illustrated in FIG. 2, the battery safety monitoring method may include following operations.

At block 1, a battery voltage of a battery of the electronic device is obtained in real time.

At block 2, whether a voltage jump occurs in the battery of the electronic device is determined according to the battery voltage obtained in real time.

Figure 3:
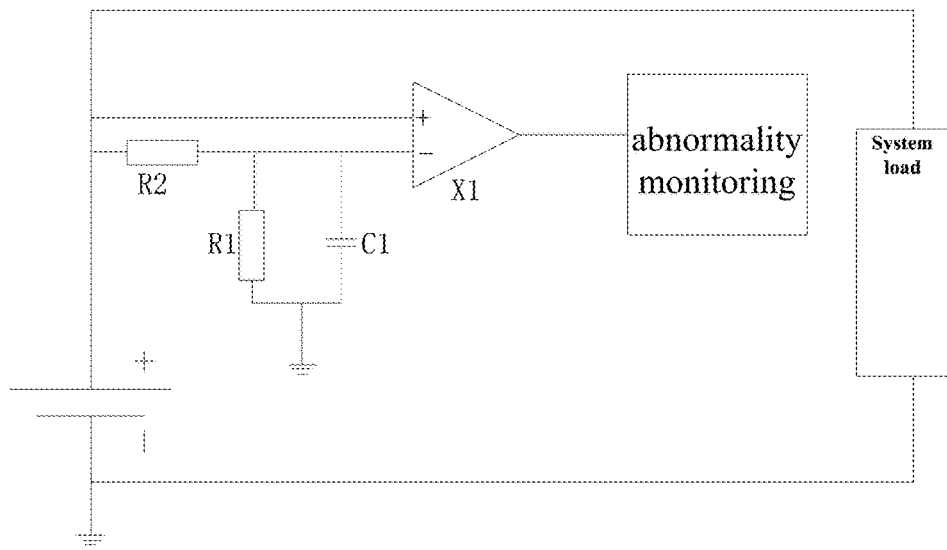
FIG. 3 is a schematic diagram illustrating a voltage jump monitoring circuit according to an embodiment of the present disclosure.

In an embodiment of the present disclosure, the battery voltage can be detected in real time by building a differential amplification circuit. As an example, the differential amplification circuit may be as illustrated in FIG. 3, which may include a resistor R1, a resistor R2, a capacitor C1, and a differential amplifier X1. A first end of the resistor R2 is coupled to a cathode of the battery, and a second end of the resistor R2 is coupled to a negative input end of the differential amplifier. The resistor R1 and the capacitor C1 together form an RC voltage stabilization and filter circuit. A first end of the resistor R1 is coupled to the negative input end of the differential amplifier X1, and a second end of the resistor R1 is grounded. The capacitor C1 is coupled to the resistor R1 in parallel, and a positive input end of the differential amplifier X1 is coupled to the cathode of the battery. The battery voltage can be monitored in real time through the differential amplification circuit, and whether the voltage jump occurs in the battery voltage can be determined according to an output signal of the differential amplification circuit.

It can be understood that the capacitor C1 is coupled between the negative input end of the differential amplifier X1 and the ground. When the voltage jump of the battery voltage occurs, the voltage of the negative input end of the differential amplifier X1 maintains unchanged for a certain period of time due to the existence of the capacitor, but the voltage of the positive input end of the differential amplifier X1 jumps directly, and the output of the differential amplifier X1 is inverted. In this manner, whether the voltage jump occurs in the battery can be determined by monitoring the output signal of the differential amplifier X1.

It can be understood that, in other embodiments of the present disclosure, the battery voltage can be detected in real time by other voltage detection circuits, thereby realizing real-time monitoring of the battery voltage. The various implementations of the circuit for detecting the battery voltage are known to those skilled in the art and will not be elaborated herein.

At block 3, the battery is determined as abnormal currently when the voltage jump occurs in the battery.

In embodiments of the present disclosure, the inventors have found through extensive tests and experiments that the voltage of the battery is relatively stable during normal use, but once the battery is subjected to external mechanical damages such as falling, impacting, squeezing and puncturing, the voltage jump of the battery voltage occurs. Therefore, the battery safety monitoring method of embodiments of the present disclosure monitors whether the battery is damaged currently by monitoring whether the voltage jump occurs in the voltage of the battery. Once the voltage jump of the battery voltage is detected, it indicates that the battery is damaged and an internal short circuit occurs, and it is determined that the battery is currently abnormal and has a certain safety hazard.

According to an embodiment of the present disclosure, when the battery is in a no-load condition or a light load condition, if the voltage jump occurs in the battery, it is determined that the battery is abnormal currently.

The battery being in the no-load condition refers to that the battery is not discharging currently, and there is no consumption current, for example, the electronic device is in an off state. The battery being in the light load condition refers to that the present consumption current of the battery is very small, such as about 5 mA to 6 mA, for example, the electronic device is in a standby state or the system load is small.

Determining whether the voltage jump occurs in the battery of the electronic device according to the battery voltage obtained in real time includes: determining whether an instantaneous voltage drop occurs in the battery according to the battery voltage obtained in real time, and determining that the voltage jump occurs, when the instantaneous voltage drop occurs in the battery.

It is determined that the instantaneous voltage drop occurs in the battery, when a magnitude of a voltage drop of the battery voltage within a preset time period is greater than or equal to a preset value.

Specifically, in one example of the present disclosure, when the battery is in the no-load condition or the light load condition, the preset value is greater than or equal to 10 mV, for example, may be 150-400 mV.

Figure 4:
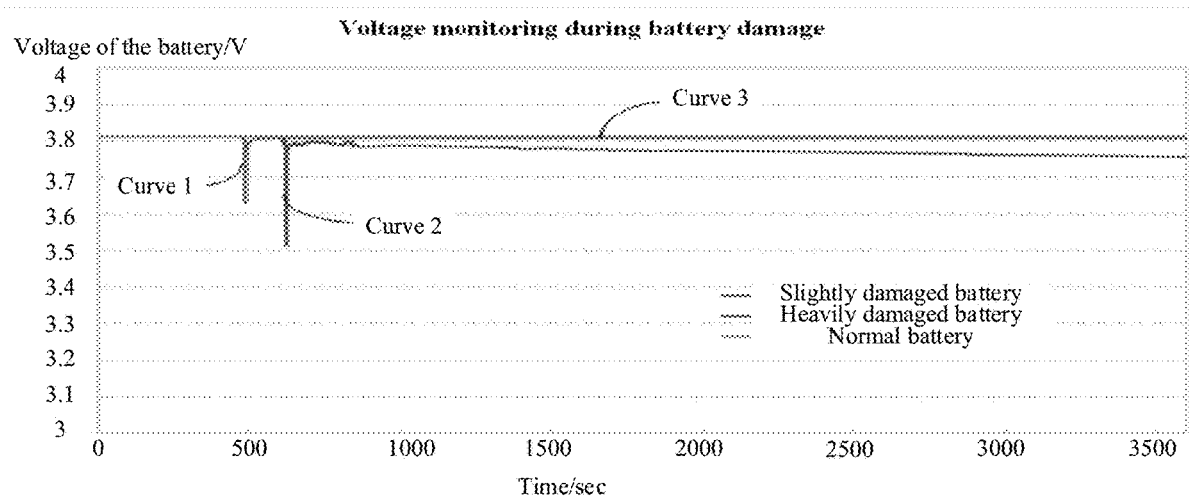
FIG. 4 is a schematic diagram illustrating a comparison of voltage monitoring curves of a damaged battery and a normal battery according to an embodiment of the present disclosure.

Specifically, according to an embodiment of the present disclosure, voltage monitoring in the damage process of the battery is as illustrated in FIG. 4. Curve 1 represents the voltage change when the battery is slightly damaged, curve 2 represents the voltage change when the battery is seriously damaged, and curve 3 represents the voltage change when the battery is normal without damage. It can be seen from curve 1 that when the battery is slightly damaged, the battery voltage instantaneously drops from 3.8V to 3.63V and then back to about 3.8V. It can be seen from curve 2 that when the battery is seriously damaged, the battery voltage instantaneously drops from 3.8V to 3.51V and then back to about 3.8V. It can be seen from curve 3 that the battery voltage is basically stable at 3.8V when the battery is normal without damage. Therefore, by comparing curve 1, curve 2 and curve 3, it can be seen that once the battery is subjected to external mechanical damages such as falling, impacting, squeezing and penetrating, the voltage jump of the battery occurs, that is, the voltage of the battery suddenly drops and the magnitude of the voltage drop is different depending on the degree of damage. The present disclosure monitors whether the battery is damaged currently by monitoring whether the instantaneous voltage jump of the battery voltage occurs. Once the instantaneous drop of the battery voltage is detected, it is determined that the battery is damaged currently and has an internal short circuit, and it is also determined that the battery is abnormal currently and has a certain safety hazard.

Therefore, according to the battery safety monitoring method of embodiments of the present disclosure, by determining whether the battery is abnormal currently by detecting whether the voltage jump of the battery voltage occurs, the battery damage can be monitored in real time once it occurs, and thus timely reminder and maintenance can be achieved, thereby avoiding the safety hazards caused by abnormal battery and greatly improving the safety of the electronic device in use.

According to an embodiment of the present disclosure, when the battery is abnormal currently, the abnormal battery is marked, and the electronic device is controlled to issue a reminder message when the electronic device is on, for indicating that the battery is abnormal.

Figure 5:
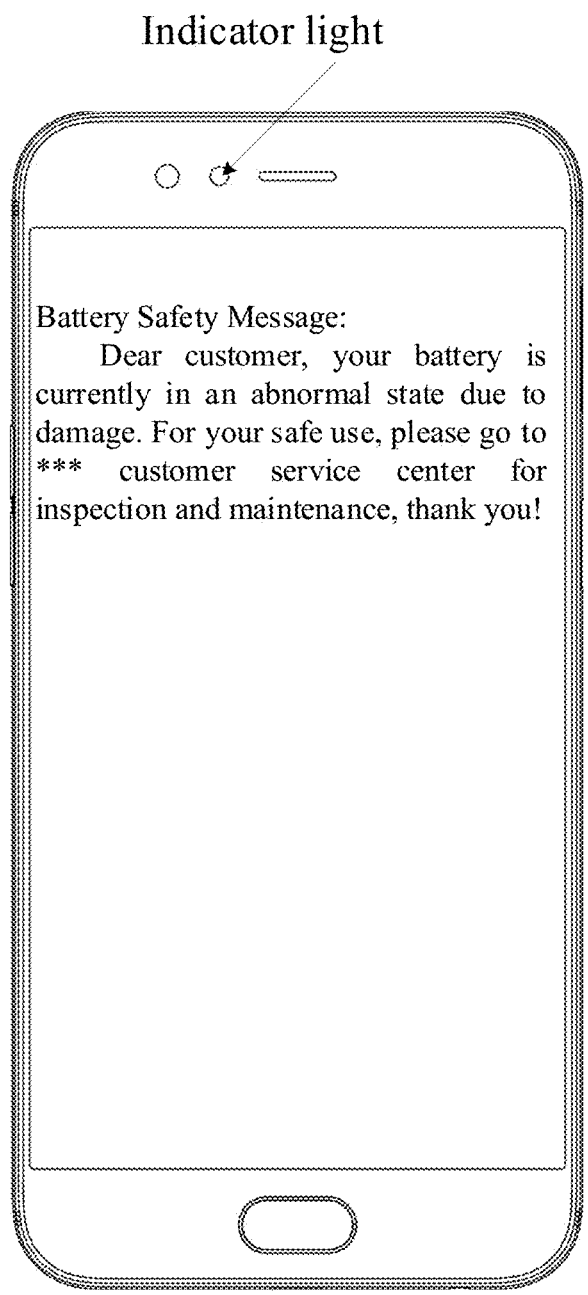
FIG. 5 is a schematic diagram of a reminder message of a mobile terminal according to an embodiment of the present disclosure.

For example, when it is monitored that the battery is abnormal currently, there is a need to alert the user. As an example, as illustrated in FIG. 5, the users can be alerted by the following message "Battery Safety Message: Dear customer, your battery is currently in an abnormal state due to damage. For your safe use, please go to *** customer service center for inspection and maintenance, thank you!". As another example, while displaying the message as illustrated in FIG. 5 to alert the user, the user may also be altered by flashing the indicator light disposed on the mobile terminal, for example, controlling the indicator light to emit red light at a high frequency. As yet another example, the user may also be alerted by the voice playing function in the electronic device.

In general, when seeing the above reminder message, the user will promptly go to the corresponding customer service center for inspection and maintenance. However, some users are not sure about the seriousness of the problem when they see the message, so it is likely for them to ignore the message, and continue to use the electronic device. In this case, the user should be alerted repeatedly, for example, at least three times. If the user still does not seek for maintenance after a plurality of reminder, some functions of the electronic device can be limited.

According to an embodiment of the present disclosure, when the voltage jump of the battery occurs, a fault grade is further determined according to a situation of the voltage jump, and a corresponding function of the electronic device is limited according to the fault grade.

That is, the fault grade can be determined according to the magnitude of the instantaneous voltage drop of the battery voltage. For example, the larger the magnitude of the instantaneous voltage drop of the battery voltage is, the more serious the battery damage is. Therefore, the battery damage can be divided into general damage, comparatively severe damage, severe damage and battery failure, the corresponding fault grade may be general grade, comparatively severe grade, severe grade, and complete fault grade, and further the corresponding function of the electronic device can be limited according to the fault grade.

For example, in general, the lower the power consumption of an application in the electronic device is, the less heat is generated when the battery is used. For example, when the chatting application is activated, but the video chat is not performed, the battery power consumption is small at this time and the battery generates less heat, and thus the battery is less likely to cause safety incidents. When the application consumes a large amount of power, for example, by watching videos and playing games, the battery power consumption is large at this time and the battery generates more heat, and thus the battery is likely to cause safety incidents. Therefore, when it is determined that there is an abnormality in the battery, if the fault grade is general grade, certain applications such as video software and game software that consume a large amount of power shall be banned, or if the fault grade is comparatively severe grade or severe grade, the entire system can be directly prohibited to prevent the occurrence of safety incidents, and the message "The battery has potential safety hazard, the activation of system is prohibited, please go to the customer service center of *** for inspection and maintenance, thank you for your cooperation!" can be displayed on the screen of the electronic device, to remind the user, or if the fault grade is complete fault grade, the battery fails, the system is off and cannot be started.

In addition, heat is also generated during the charging process of the battery. In particular, in the state of fast charging, more heat is generated in a short time. When it is determined that the battery is abnormal, the battery is also prohibited from fast charging. In severe cases, the user may be banned from charging the battery to prevent safety incidents, and the user will be alerted through the message displayed on the screen of the electronic device "The battery is damaged and cannot be charged. Please check the customer service center of *** for inspection and maintenance, thank you for your cooperation!".

In conclusion, with the battery safety monitoring method according to embodiments of the present disclosure, the battery voltage of the electronic device is obtained in real time, and then whether the voltage jump occurs in the battery of the electronic device is determined according to the battery voltage obtained in real time, and finally the battery is determined to be abnormal currently when the voltage jump occurs. That is, the voltage jump occurs in the voltage of the battery when the battery is damaged. The present disclosure determines whether the battery is abnormal by detecting whether the voltage jump occurs in the voltage of the battery, so that the battery damage can be monitored in real time once it occurs, and thus timely reminder and maintenance can be achieved, thereby avoiding safety hazards caused by the battery abnormality, and greatly improving the safety of the electronic device in use.

In addition, embodiments of the present disclosure provide a non-transitory computer-readable storage medium. The storage medium is stored thereon with a computer program that, when executed by a processor, perform the battery safety monitoring method described above.

The non-transitory computer-readable storage medium according to embodiments of the present disclosure, by performing the above-mentioned battery safety monitoring method, can determine whether the battery is abnormal by monitoring whether the voltage jump of the battery occurs, so that the abnormality can be monitored in real time once the battery is damaged, and thus timely reminder and maintenance can be achieved, thereby avoiding safety hazards caused by the battery abnormality, and greatly improving the safety of the electronic device in use.

Figure 6:
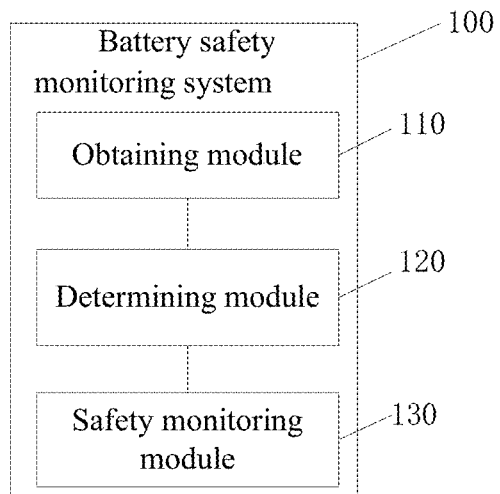
FIG. 6 is a schematic block diagram illustrating a battery safety monitoring system according to an embodiment of the present disclosure.

Embodiments of the present disclosure further provide a battery safety monitoring system. FIG. 6 is a schematic block diagram illustrating a battery safety monitoring system according to an embodiment of the present disclosure. The battery safety monitoring system is applicable to an electronic device. As illustrated in FIG. 6, the battery safety monitoring system 100 includes an obtaining module 110, a determining module 120 and a safety monitoring module 130.

The obtaining module 110 is configured to obtain a battery voltage of a battery of the electronic device in real time. The determining module 120 is configured to determine whether a voltage jump occurs in the battery of the electronic device according to the battery voltage obtained in real time. The safety monitoring module 130 is configured to determine that the battery is abnormal currently when the voltage jump occurs in the battery.

The battery voltage can be detected in real time by building a differential amplification circuit. As an example, the differential amplification circuit may be as illustrated in FIG. 3, which may include a resistor R1, a resistor R2, a capacitor C1, and a differential amplifier X1. A first end of the resistor R2 is coupled to the cathode of the battery, and a second end of the resistor R2 is coupled to a negative input end of the differential amplifier X1. The resistor R1 and the capacitor C1 together form an RC voltage stabilization and filter circuit. A first end of the resistor R1 is coupled to a negative input end of the differential amplifier X1, and a second end of the resistor R1 is grounded. The capacitor C1 is coupled to the resistor R1 in parallel, and a positive input end of the differential amplifier X1 is also coupled to the cathode of the battery, the battery voltage can be monitored in real time by the differential amplification circuit, and whether the voltage jump occurs in the voltage of the battery can be determined according to the output signal of the differential amplification circuit.

It can be understood that the capacitor C1 is coupled between the negative input end of the differential amplifier X1 and the ground. When the voltage jump of the battery voltage occurs, the voltage of the negative input end of the differential amplifier X1 maintains unchanged for a certain period of time due to the existence of the capacity, but the voltage of the positive input end of the differential amplifier X1 jumps directly, and the output of the differential amplifier X1 is inverted. In this manner, whether the voltage jump occurs in the battery can be determined by monitoring the output signal of the differential amplifier X1.

It can be understood that, in other embodiments of the present disclosure, the battery voltage can be detected in real time by other voltage detection circuits, thereby realizing real-time monitoring of the battery voltage. The various implementations of the circuit for detecting the voltage of the battery are known to those skilled in the art and will not be elaborated herein.

According to an embodiment of the present disclosure, when the battery is in a no-load condition or a light load condition, the safety monitoring module 130 determines that the battery is abnormal currently if the voltage jump occurs in the voltage of the battery.

The battery being in the no-load condition refers to that the battery is not discharging currently, and there is no consumption current, for example, the electronic device is in an off state. The battery being in the light load condition refers to that the consumption current of the battery at present is very small, such as about 5 mA to 6 mA, for example, the electronic device is in a standby state or the system load is small.

According to an embodiment of the present disclosure, the determining module 120 is further configured to determine whether an instantaneous voltage drop occurs in the battery according to the battery voltage obtained in real time, and determine that the voltage jump occurs if the instantaneous voltage drop occurs in the battery.

The determining module 120 determines that the instantaneous voltage drop occurs in the battery, when a magnitude of a voltage drop of the battery voltage within a preset time period is greater than or equal to a preset value.

Specifically, in one example of the present disclosure, when the battery is in the no-load condition or the light load condition, the preset value is greater than or equal to 10 mV, for example, may be 150-400 mV.

Specifically, according to an embodiment of the present disclosure, voltage monitoring in the damage process of the battery is as illustrated in FIG. 4. Curve 1 represents the voltage change when the battery is slightly damaged, curve 2 represents the voltage change when the battery is seriously damaged, and curve 3 represents the voltage change when the battery is normal without damage. It can be seen from curve 1 that when the battery is slightly damaged, the battery voltage instantaneously drops from 3.8V to 3.63V and then back to about 3.8V. It can be seen from curve 2 that when the battery is seriously damaged, the battery voltage instantaneously drops from 3.8V to 3.51V and then back to about 3.8V. It can be seen from curve 3 that the battery voltage is basically stable at 3.8V when the battery is normal without damage. Therefore, by comparing curve 1, curve 2 and curve 3, it can be seen that once the battery is subjected to external mechanical damages such as falling, impacting, squeezing and penetrating, the voltage jump of the battery occurs, that is, the voltage of the battery suddenly drops and the magnitude of the voltage drop is different depending on the degree of damage. The present disclosure monitors whether the battery is damaged currently by monitoring whether the instantaneous voltage jump of the battery occurs. Once the instantaneous voltage drop of the battery voltage is detected, it is determined that the battery is damaged currently and has an internal short circuit, and it is also determined that the battery is abnormal at this time and has a certain safety hazard.

Therefore, according to the battery safety monitoring system of embodiments of the present disclosure, by determining whether the battery is abnormal currently by detecting whether the voltage jump of the battery voltage occurs, the battery abnormality can be monitored in real time once the battery is damaged, and thus timely reminder and maintenance can be achieved, thereby avoiding the safety hazards caused by abnormal battery and greatly improving the safety of the electronic device in use.

According to an embodiment of the present disclosure, when the battery is abnormal currently, the safety monitoring module 130 is further configured to mark the battery as abnormal, and control the electronic device to issue a reminder message when the electronic device is on, for indicating that the battery is abnormal.

For example, when it is monitored that the battery is abnormal currently, there is a need to alert the user. As an example, as illustrated in FIG. 5, the users can be alerted by the following message "Battery Safety Message: Dear customer, your battery is currently in an abnormal state due to damage. For your safe use, please go to * customer service center for inspection and maintenance, thank you!". As another example, while displaying the message as illustrated in FIG. 5** to alert the user, the user may also be altered by flashing the indicator light disposed on the mobile terminal, for example, controlling the indicator light to emit red light at a high frequency. As yet another example, the user may also be alerted by the voice playing function in the electronic device.

In general, when seeing the above reminder message, the user will promptly go to the corresponding customer service center for inspection and maintenance. However, some users are not sure about the seriousness of the problem when they see the message, so it is likely for them to ignore the message, and continue to use the electronic device. In this case, the user should be alerted repeatedly, for example, at least three times. If the user still does not seek for maintenance after a plurality of reminder, some functions of the electronic device can be limited.

According to an embodiment of the present disclosure, when the voltage jump occurs, the safety monitoring module 130 is further configured to determine a fault grade according to a situation of the voltage jump, and limit a corresponding function of the electronic device according to the fault grade.

In an embodiment, the safety monitoring module 130 may determine the fault grade according to the magnitude of the instantaneous voltage drop of the battery voltage. For example, the larger the magnitude of the instantaneous voltage drop of the battery voltage is, the more serious the battery damage is. Therefore, the battery damage can be divided into general damage, comparatively severe damage, severe damage and battery failure, the corresponding fault grade may be general grade, comparatively severe grade, severe grade, and complete fault grade, and further the corresponding functions of the electronic device can be limited according to the fault grade.

For example, in general, the lower the power consumption of an application in the electronic device is, the less heat is generated when the battery is used. For example, when the chatting application is activated, but the video chat is not performed, the battery power consumption is small at this time and the battery generates less heat, and thus it is unlikely to cause safety incidents. When the application consumes a large amount of power, for example, by watching videos and playing games, the battery power consumption is large at this time and the battery generates more heat, and thus it is likely to cause safety incidents. Therefore, when it is determined that there is an abnormality in the battery, if the fault grade is general grade, certain applications such as video software and game software that consume a large amount of power shall be banned by the safety monitoring module 130, or if the fault grade is comparatively severe grade or severe grade, the entire system can be directly prohibited by the safety monitoring module 130 to prevent the occurrence of safety incidents, and the message "The battery has potential safety hazard, the activation of system is prohibited, please go to the customer service center of *** for inspection and maintenance, thank you for your cooperation!" can be displayed on the screen of the electronic device, to remind the user, or if the fault grade is complete fault grade, the battery fails, the system is off and cannot be started.

In addition, heat is also generated during the charging process of the battery. In particular, in the state of fast charging, more heat is generated in a short time. When it is determined that the battery is abnormal, the battery is also prohibited by the safety monitoring module 130 from fast charging. In severe cases, the user may be banned from charging the battery to prevent safety incidents, and the user will be alerted through the message displayed on the screen of the electronic device "The battery is damaged and cannot be charged. Please check the customer service center of *** for inspection and maintenance, thank you for your cooperation!".

In embodiments of the present disclosure, the safety monitoring module 130 may be a battery manager with a battery management function, or may be a battery protection system with a battery protection function, or may be an electronic device control system with an integrated battery management function, battery protection function and electronic device control function, which will not be specifically limited in the present disclosure.

According to the battery safety monitoring system of embodiments of the present disclosure, the obtaining module obtains the battery voltage of the electronic device in real time, and then the determining module determines whether the voltage jump occurs in the battery of the electronic device according to the battery voltage obtained in real time, and finally the safety monitoring module determines that the battery is abnormal currently when the voltage jump occurs in the battery. That is, the voltage jump occurs in the battery voltage when the battery is damaged currently. The present disclosure determines whether the battery is abnormal by detecting whether the voltage jump occurs in the battery voltage, so that the abnormality can be monitored in real time once the battery is damaged, and thus timely reminder and maintenance can be achieved, thereby avoiding safety hazards caused by the battery abnormality, and greatly improving the safety of the electronic device in use.

Figure 7:
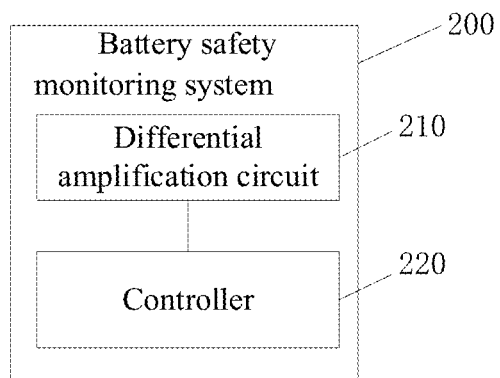
FIG. 7 is a schematic block diagram illustrating a battery safety monitoring system according to another embodiment of the present disclosure.

FIG. 7 is a schematic block diagram illustrating a battery safety monitoring system according to another embodiment of the present disclosure. The system is applicable to an electronic device. As illustrated in FIG. 7, the system 200 includes a differential amplification circuit 210 and a controller 220.

The differential amplification circuit 210 is configured to detect a battery voltage of a battery of the electronic device in real time. The controller 220 is coupled to the differential amplification circuit 210, and is configured to determine whether a voltage jump occurs in the battery of the electronic device according to the battery voltage obtained in real time, and determine that the battery is abnormal currently when the voltage jump occurs in the battery.

With respect to detailed implementation of the differential amplification circuit 210 and the controller 220, reference may be made to the above description, which will not be elaborated here.

Figure 8:
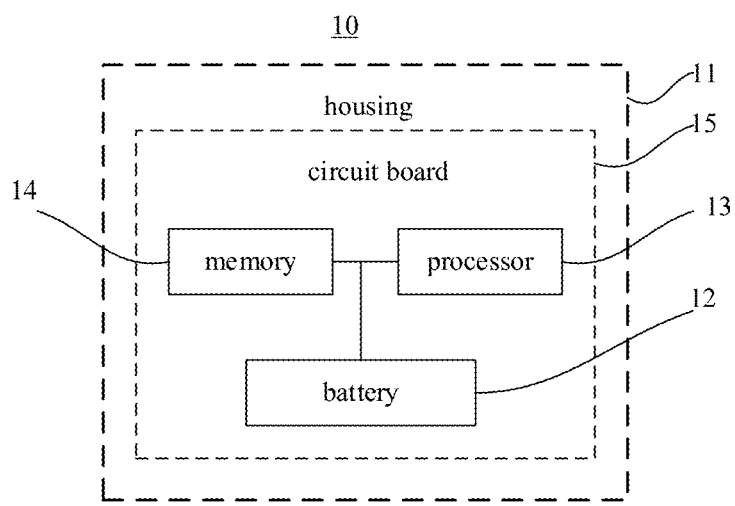
FIG. 8 is a schematic block diagram illustrating an electronic device according to embodiments of the present disclosure.

In addition, as illustrated in FIG. 8, embodiments of the present disclosure further provide an electronic device 10. The electronic device 10 includes a housing 11, a battery 12, a processor 13, a memory 14 and a circuit board 15.

The circuit board 15 is enclosed by the housing 11. The processor 13 and the memory 14 are positioned on the circuit board 15. The battery 12 is configured to provide power for the electronic device 10. The memory 14 is configured to store executable program codes. The processor 13 is configured to run a program corresponding to the executable program codes by reading the executable program codes stored in the memory, to perform the battery safety monitoring method described above, which will not be elaborated here for the sake of simplicity and clarity.

The electronic device according to embodiments of the present disclosure can determine whether the battery is abnormal currently by detecting whether the voltage jump occurs in the battery voltage, so that the abnormality can be monitored in real time once the battery is damaged, and thus timely reminder and maintenance can be achieved, thereby avoiding safety hazards caused by the battery abnormality, and greatly improving the use safety.

In the description of the present disclosure, it is to be understood that, terms such as "center", "longitudinal", "lateral", "length", "width", "thickness", "over", "below", "front", "back", "left", "right", "vertical", "horizontal", "top", "bottom", "in", "out", "clockwise", "anti-clockwise", "axial", "radial" and "circumference" refer to the directions and location relations which are the directions and location relations shown in the drawings, and for describing the present disclosure and for describing in simple, and which are not intended to indicate or imply that the device or the elements are disposed to locate at the specific directions or are structured and performed in the specific directions, which could not to be understood to the limitation of the present disclosure.

In addition, terms such as "first" and "second" are used herein for purposes of description and are not intended to indicate or imply relative importance or significance. Furthermore, the feature defined with "first" and "second" may comprise one or more this feature distinctly or implicitly. In the description of the present disclosure, "a plurality of" means two or more than two, unless specified otherwise.

In the present disclosure, unless specified or limited otherwise, the terms "mounted," "connected," "coupled" and "fixed" are understood broadly, such as fixed, detachable mountings, connections and couplings or integrated, and can be mechanical or electrical mountings, connections and couplings, and also can be direct and via media indirect mountings, connections, and couplings, and further can be inner mountings, connections and couplings of two components or interaction relations between two components, which can be understood by those skilled in the art according to the detail embodiment of the present disclosure.

In the present disclosure, unless specified or limited otherwise, the first characteristic is "on" or "under" the second characteristic refers to the first characteristic and the second characteristic can be direct or via media indirect mountings, connections, and couplings. And, the first characteristic is "on", "above", "over" the second characteristic may refer to the first characteristic is right over the second characteristic or is diagonal above the second characteristic, or just refer to the horizontal height of the first characteristic is higher than the horizontal height of the second characteristic. The first characteristic is "below" or "under" the second characteristic may refer to the first characteristic is right over the second characteristic or is diagonal under the second characteristic, or just refer to the horizontal height of the first characteristic is lower than the horizontal height of the second characteristic.

In the description of the present disclosure, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. Without a contradiction, the different embodiments or examples and the features of the different embodiments or examples can be combined by those skilled in the art.

Those skilled in the art will appreciate that the elements and algorithm steps of the various examples described in combination with the embodiments disclosed herein can be implemented in electronic hardware or a combination of computer software and electronic hardware. Whether these functions are implemented by hardware or software depends on the specific application and restrictive conditions on design. A person skilled in the art can use different methods for implementing the described functions for each particular application, but such implementation should not be considered to be beyond the scope of the present disclosure.

A person skilled in the art can clearly understand that for the convenience and brevity of the description, the specific working process of the system, the device and the unit described above can refer to the corresponding process in the above method embodiment, and details are not described herein again.

In several embodiments provided by the present disclosure, it should be understood that, the system, devices and method disclosed in several embodiments provided by the present disclosure can be realized in any other manner. For example, the device embodiments described above can be merely exemplary, for example, the units are just divided according to logic functions. In practical implementation, the units can be divided in other manners, for example, multiple units or components can be combined or integrated into another system, or some features can be omitted or not executed. In addition, the mutual coupling or direct coupling or communication connection described or discussed can be via some interfaces, and indirect coupling or communication connection between devices or units may be electrical, mechanical or of other forms.

The units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure In addition, respective functional units in respective embodiments of the present disclosure can be integrated into one processing unit, or can be present as separate physical entities. It is also possible that two or more than two units are integrated into one unit.

If the functions are realized in form of functional software units and are sold or used as separate products, they can be stored in a computer readable storage medium. Based on this understanding, the parts of the technical solutions or the essential parts of the technical solutions (i.e. the parts making a contribution to the related art) can be embodied in form of software product, which is stored in a storage medium, and includes several instruction used for causing a computer device (for example, a personal computer, a server or a network device) to execute all or part of steps in the methods described in respective embodiments of the present disclosure. The above storage medium may be any medium capable of storing program codes, including a USB flash disk, a mobile hard disk, a Read-Only Memory (ROM), a Random Access Memory (RAM), a disc, or a light disk.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. A battery safety monitoring method, applicable to an electronic device and comprising:
    obtaining a battery voltage of a battery of the electronic device in real time;
    determining whether a voltage jump occurs in the battery of the electronic device according to the battery voltage obtained in real time;
    determining that the battery is abnormal currently, when the voltage jump occurs in the battery; and
    when the voltage jump occurs, determining a fault grade according to a situation of the voltage jump, and limiting a corresponding function of the electronic device according to the fault grade;
    wherein the fault grade comprises a general grade, a comparatively severe grade, a severe grade, or a complete fault grade;
    wherein:
        when the fault grade is the general grade, video software and game software in the terminal device is disabled;
        when the fault grade is the comparatively severe grade or the severe grade, an entire system of the terminal device is prohibited; and
        when the fault grade is the complete fault grade, the battery fails, the system of the terminal device is off and cannot be started.

2. The battery safety monitoring method according to claim 1, wherein, when the battery is in a no-load condition or a light load condition, if the voltage jump occurs, the battery is determined as abnormal currently.

3. The battery safety monitoring method according to claim 1, further comprising:
    marking a state of the battery as abnormal when the battery is abnormal currently; and
    controlling the electronic device to issue a reminder message when the electronic device is on, for indicating that the battery is abnormal.

4. The battery safety monitoring method according to claim 2, wherein, determining whether a voltage jump occurs in the battery of the electronic device according to the battery voltage obtained in real time comprises:
    determining whether an instantaneous voltage drop occurs in the battery according to the battery voltage obtained in real time; and
    determining that the voltage jump occurs, if the instantaneous voltage drop occurs in the battery.

5. The battery safety monitoring method according to claim 4, wherein, an occurrence of the instantaneous drop of the battery voltage is determined when a magnitude of a voltage drop of the battery voltage within a preset time period is greater than or equal to a preset value.

6. The battery safety monitoring method according to claim 5, wherein, the preset value is greater than or equal to 10 mV.

7. A battery safety monitoring system, applicable to an electronic device, and comprising:
    a differential amplification circuit, configured to detect a battery voltage of a battery of the electronic device in real time; and
    a controller, coupled to the differential amplification circuit, and configured to:
        determine whether a voltage jump occurs in the battery of the electronic device according to the battery voltage obtained in real time;
        determine that the battery is abnormal currently when the voltage jump occurs in the battery; and
        when the voltage jump occurs, determine a fault grade according to a situation of the voltage jump, and limit a corresponding function of the electronic device according to the fault grade;
    wherein the fault grade comprises a general grade, a comparatively severe grade, a severe grade, or a complete fault grade;
    wherein:
        when the fault grade is the general grade, video software and game software in the terminal device is disabled;
        when the fault grade is the comparatively severe grade or the severe grade, an entire system of the terminal device is prohibited; and
        when the fault grade is the complete fault grade, the battery fails, the system of the terminal device is off and cannot be started.

8. The battery safety monitoring system according to claim 7, wherein, when the battery is in a no-load condition or a light load condition, the controller is configured to determine that the battery is abnormal currently if the voltage jump occurs.

9. The battery safety monitoring system according to claim 7, wherein, when the battery is abnormal currently, the controller is further configured to mark a state of the battery as abnormal and control the electronic device to issue a reminder message when the electronic device is on, for indicating that the battery is abnormal.

10. The battery safety monitoring system according to claim 8, wherein, the controller is configured to:
    determine whether an instantaneous voltage drop occurs in the battery according to the battery voltage obtained in real time; and
    determine that the voltage jump occurs, if the instantaneous voltage drop occurs in the battery.

11. The battery safety monitoring system according to claim 10, wherein, the controller is configured to determine that the instantaneous voltage drop occurs in the battery, when a magnitude of a voltage drop of the battery voltage within a preset time period is greater than or equal to a preset value.

12. An electronic device, comprising a housing, a battery, a processor, a memory, and a circuit board, wherein,
the circuit board is enclosed by the housing;
the processor and the memory are positioned on the circuit board;
the battery is configured to provide power for the electronic device;
the memory is configured to store executable program codes; and
the processor is configured to run a program corresponding to the executable program codes by reading the executable program codes stored in the memory, to perform following operations:
obtaining a battery voltage of a battery of the electronic device in real time;
determining whether a voltage jump occurs in the battery of the electronic device according to the battery voltage obtained in real time;
determining that the battery is abnormal currently, when the voltage jump occurs in the battery; and
when the voltage jump occurs, determining a fault grade according to a situation of the voltage jump, and limiting a corresponding function of the electronic device according to the fault grade;
wherein the fault grade comprises a general grade, a comparatively severe grade, a severe grade, or a complete fault grade;
wherein:
when the fault grade is the general grade, video software and game software in the terminal device is disabled;
when the fault grade is the comparatively severe grade or the severe grade, an entire system of the terminal device is prohibited; and
when the fault grade is the complete fault grade, the battery fails, the system of the terminal device is off and cannot be started.

13. The electronic device according to claim 12, further comprising:
a display, configured to display a reminder message when the electronic device is on, for indicating that the battery is abnormal.

14. The electronic device according to claim 12, wherein the electronic device is a mobile terminal.

15. The electronic device according to claim 12, wherein the electronic device is prohibited from fast charging when the battery is abnormal.

16. The battery safety monitoring system according to claim 7, wherein the differential amplification circuit comprises:
a first resistor, wherein a first end of the first resistor is grounded;
a second resistor, wherein a first end of the second resistor is coupled to a cathode of the battery;
a capacitor coupled to the first resistor in parallel; and
a differential amplifier, wherein a negative input end of the differential amplifier is coupled to a second end of the first resistor and a second end of the second resistor respectively, a positive input end of the differential amplifier is coupled to the cathode of the battery, and an output end of the differential amplifier is coupled to the controller.

17. The battery safety monitoring system according to claim 7, wherein the controller is further configured to prohibit the electronic device from fast charging when the battery is abnormal.

18. The battery safety monitoring method according to claim 1, further comprising:
prohibiting the electronic device from fast charging when the battery is abnormal.

* * * * *